US005120578A

United States Patent [19]

Chen et al.

[11] Patent Number: 5,120,578

[45] Date of Patent: Jun. 9, 1992

[54] COATING COMPOSITION

[75] Inventors: Jensheng Chen, Waltham; Philip D. Knudsen, Northboro, both of Mass.

[73] Assignee: Shipley Company Inc., Newton, Mass.

[21] Appl. No.: 737,352

[22] Filed: Jul. 29, 1991

Related U.S. Application Data

[62] Division of Ser. No. 531,440, May 31, 1990, Pat. No. 5,076,841.

[51] Int. Cl.$^5$ .................... B05D 3/04; B05D 3/10
[52] U.S. Cl. .................... 427/304; 361/331; 427/305; 427/306; 427/404; 427/443.1
[58] Field of Search .................... 106/1.25, 1.26, 1.28; 427/304–306, 404, 443.1; 361/331

[56] References Cited

U.S. PATENT DOCUMENTS

| 3,011,920 | 12/1961 | Shipley | 117/213 |
|---|---|---|---|
| 3,445,350 | 5/1969 | Klinger et al. | 204/30 |
| 3,471,313 | 10/1969 | Saubestre et al. | 117/47 |
| 3,560,257 | 2/1971 | Schneble, Jr. et al. | 252/514 X |
| 3,661,597 | 5/1972 | Gulla | 106/1 |
| 3,728,137 | 4/1973 | Shipley et al. | 106/1 |
| 3,754,070 | 8/1973 | Dunn et al. | 264/272 |
| 3,765,936 | 10/1973 | Shipley et al. | 174/68.5 X |
| 3,940,533 | 2/1976 | Arsac | 428/225 |
| 3,958,066 | 5/1976 | Imamura et al. | 428/372 |
| 4,113,658 | 12/1978 | Geus | 252/454 |
| 4,126,582 | 11/1978 | Diem et al. | 252/476 |
| 4,253,875 | 3/1981 | Heymann et al. | 106/1.26 |
| 4,447,492 | 5/1984 | McKauney | 428/328 |
| 4,511,494 | 4/1985 | Frommer et al. | 252/518 |
| 4,514,486 | 4/1985 | Shirose et al. | 430/124 |
| 4,556,507 | 12/1985 | Tomibe et al. | 252/518 |
| 4,639,380 | 1/1987 | Amelio et al. | 427/97 |
| 4,663,240 | 5/1987 | Hajdu et al. | 428/545 |
| 4,670,306 | 6/1987 | Salem | 427/258 |
| 4,696,764 | 9/1987 | Yamazaki | 252/503 |
| 4,752,415 | 6/1988 | Iwaskow et al. | 252/511 |
| 4,774,270 | 9/1988 | Sullivan et al. | 523/334 |
| 4,775,557 | 10/1988 | Bastenbeck et al. | 427/307 |
| 4,783,243 | 11/1988 | Ando et al. | 204/15 |
| 4,820,553 | 4/1989 | Supchak et al. | 427/304 |
| 4,863,758 | 9/1989 | Rhodenizer | 427/97 |
| 4,868,008 | 9/1989 | Marikar et al. | 427/126.1 |
| 4,895,739 | 1/1990 | Bladen | 427/304 |
| 4,981,725 | 1/1991 | Nuzzi et al. | 427/304 |

FOREIGN PATENT DOCUMENTS

| 676894 | 12/1963 | Canada. |
| 512204 | 6/1976 | U.S.S.R.. |
| 2169925A | 7/1986 | United Kingdom. |

*Primary Examiner*—Michael Lusignan
*Attorney, Agent, or Firm*—Robert L. Goldberg

[57] ABSTRACT

The invention discloses a new electroless plating catalyst and a process of using the same for selective plating. The catalyst and process are especially adapted for formation of EMI shielding for electronic components. The electroless plating catalyst comprises particulates dispersed in a liquid film forming composition which particulates are coated with a hydrous oxide that is reduced to a catalytic metal in contact with an electroless plating solution.

9 Claims, No Drawings

COATING COMPOSITION

This is a divisional of copending application(s) Ser. No. 07/531,440 filed on May 31, 1990, now U.S. Pat. No. 5,076,841.

BACKGROUND OF THE INVENTION

1. Introduction

This invention relates to a process and materials for electroless metal deposition. More particularly, this invention relates to a novel electroless plating catalyst composition comprising a particulate having an adsorbed coating of a hydrous oxide of a metal, said particulate being uniformly dispersed in a liquid coating composition and said metal of the hydrous oxide being a metal that is catalytic to electroless metal deposition when contacted with a plating solution containing a reducing agent and to a metal coating process using said plating catalyst. The plating catalyst and process are especially suitable for selective electroless metal deposition such as in the formation of electromagnetic interference (EMI) and radio frequency interference (RFI) shielding for housings for electronic equipment.

2. Discussion of Prior Art

Electromagnetic interference emissions are undesirable energy emissions within a frequency range of from less than 60 Hz to more than 1,000 MHz. Radio frequency interference (RFI) is the portion of EMI radiation in about the 0.01 to 1,000 MHz range.

EMI radiation is created by operation of many diverse forms of electronic equipment ranging from microwave equipment to home computers. The radiation occurs because electronic devices emit "noise" in the above frequency range that is picked up by other devices or by conduction through power lines that act as antennas. EMI radiation may interfere with other devices and has been known to cause such diverse problems as interference with police mobile radios, communication systems, scientific test equipment and cardiac pacemakers.

In recent years, the use of electronic equipment in the home and work place has grown rapidly with a concomitant increase in sources of EMI emissions. Additionally, most housings for electronic equipment are now fabricated from plastic rather than metal. Plastics are lighter, more versatile, easier to fabricate and less expensive than metal but do not possess the intrinsic EMI/RFI shielding capabilities provided by metal enclosures.

The Federal Communications Commission has published a series of regulations concerning standards for maximum allowable EMI emissions for electronic devices. The regulations, which became effective in October 1983, apply to all digital electronic products that use or generate frequencies between 10 KHz and 1,000 MHz. These regulations therefore include commercial, industrial, business, and home products such as computers, calculators, cash registers, electronic typewriters, video equipment, and electronic games. The regulations require that the electronics industry develop electronic devices which have electromagnetic compatibility (EMC); in other words, equipment which neither interferes with other devices nor is itself susceptible to interference.

One approach to limiting electromagnetic containment is the use of an EMI shield to contain the radiation. Containment requires special shielding materials, components, and structures which prevent generated energy from escaping and acting as a source of disturbance.

The effectiveness of electromagnetic containment is determined by the degree to which the field strength is attenuated as a result of reflection or absorption by the shielding material. Shielding efficiency is calculated as a logarithmic function of the ratio of unshielded EMI transmission to shielded EMI transmission and is expressed in decibels. Because of the logarithmic nature, an increase of 30 db in shielding efficiency for a given wavelength or frequency of electromagnetic radiation represents a 1,000 percent increase in the shielding efficiency of the coating. A coating with a shielding efficiency of 30 db, for example, eliminates 99.9% of the total EMI radiation. A 60 db coating eliminates 99.9999% of the total EMI radiation.

There are several shielding methods in commercial use for nonconductive materials. The method most often used involves a metallic coating applied over a plastic housing for the electronic device. An early publication showing the use of multiple metal coatings over a plastic housing is *Engineering*, 9, Dec., 1966, pp. 1026 and 1027. Methods for applying metallic coatings disclosed in this reference include galvanic deposition, spray coating, chemical metallizing and vacuum metallizing. Metal coatings include copper, silver, chromium, nickel, silver, gold, zinc, etc.

Metals are applied over housings for electronic equipment in a number of ways. For example, EMI shielding materials have been arc-sprayed (zinc) and painted with metal-containing paints (nickel) onto the electronic housings. Both of these methods have serious disadvantages. Arc-sprayed zinc is an effective EMI shield with attenuation to 120 db or more. However, zinc is toxic and expensive, the procedure is labor intensive, and the coating is prone to cracking and peeling. Conductive nickel paints are easier to apply than arc-sprayed coatings, but do not cover recessed areas, provide attenuation to only 20 to 60 db and often require multiple coatings.

Silver and copper conductive paints have also been used in the manufacture of EMI shielding. Silver is a good conductor, but is expensive and oxidizes. Copper conductive paints are easy to apply, economical, used with conventional equipment, are wear resistant and have good resistance to flaking. However, copper tends to oxidize which results in a loss of conductivity and a concomitant loss of shielding effectiveness.

Other methods for applying metallic coating include cathode sputtering and vacuum metallizing. Such coatings show good conductivity and good adhesion, but require expensive equipment for application, are prone to microscopic cracking, can distort thermoplastics, require high power, are batch operations and are limited by part configuration.

Recently, interest has been generated in the use of electroless metals for EMI shielding. Electroless plating of surfaces for EMI shielding is shown in the prior art as early as 1967. Lordi, *Plating*, Vol. 54, p. 382, (1967), incorporated herein by reference, discusses the use of both electroless copper and electroless nickel as shielding materials. Lordi discusses electronic applications for electroless copper and electroless nickel specifically noting EMI shielding, teaches that electroless nickel can be used as an intermediate coating over copper to prevent corrosion and finally, that electroless copper can be protected by a coating of a second metal to prevent oxidation.

Recently, a number of publications have discussed the use of electroless metals for EMI applications. *Plastics Technology*, Vol. 27, June '81 p. 67, teaches the use of electroless metals as EMI shielding materials. *Plastics World*, Vol. 40, pp. 40-45, September 1982 states that electroless plating may be less expensive than many of the shielding processes now in use and can give comparable shielding performances. The economy of application of electroless plating for EMI shielding is demonstrated in a 1982 article in *Industrial Finishing*, Vol. 58, 48-51 cites several commercially available electroless plating systems for shielding applications. Smoluk reports electroless copper coatings with demonstrated SE values of 80 to 116 db, and electroless nickel coatings with SE values exceeding 45 db.

As discussed in the literature, both electroless copper and electroless nickel have been used in the electroless plating of plastic substrates. Both have advantages and disadvantages. Copper, with a relative conductivity of 1.0 (second only to silver with a conductivity of 1.05), has high shielding effectiveness. An additional advantage of copper is a relatively low cost. Disadvantages of copper are relatively low abrasion (wear) resistance and a relatively poor corrosion resistance with a strong tendency to oxidize which significantly reduces the shielding effectiveness.

Electroless nickel serves as a good paint base, has high wear resistance, stable electrical contact resistance, good solderability, and good corrosion resistance. *Plastic Design Forum*, November/December 1982, pp. 17-26, states that while electroless nickel is less conductive than electroless copper and therefore less effective as a shielding material, it possesses better corrosion resistance and may be preferable to electroless copper for EMI shielding applications, especially in severe environmental conditions. The major disadvantage to use of electroless nickel is its low relative conductivity of 0.20 or less. However, electroless nickel is relatively expensive and therefore, high cost is a disadvantage to the use of electroless nickel as a shielding material.

Disadvantages attendant to the use of electroless copper and electroless nickel separately as shielding materials are partly overcome by a dual layer of electroless copper overplated with electroless nickel. Such a dual layer is believed to be first suggested by Lordi (supra) in 1967. In 1983, Krulik, in *Industrial Finishing*, May, 1983, pp. 16-18, states that "the (electroless) copper's disadvantages are overcome by coating the copper layer with a thin layer of electroless nickel. The electroless nickel is deposited to protect the copper. The nickel's relative high cost is minimized by the thinness of the layer." A 1983 article by Hadju and Krulik in *Plating and Surface Finishing*, July, 1983, pp. 42-44, states that "a composite coating of electroless copper with a top layer of electroless nickel will combine the desirable characteristics of both. There is no degradation of the excellent shielding properties of electroless copper which can be adjusted in its shielding efficiency by varying its thickness. A relatively thin coating of electroless nickel provides corrosion resistance, paint adhesion, stable low electrical contact resistance, and other desirable properties and may be maintained at a constant thickness". A dual layer of electroless copper coated with electroless nickel is also disclosed in U.S. Pat. No. 4,514,486 incorporated herein by reference. This configuration utilizes the high conductivity of the electroless copper for EMI attenuation and the corrosion resistance of the electroless nickel to protect the copper against oxidation.

Briefly, electroless plating of plastics comprises immersing a part in a series of aqueous baths which both prepare the surface of the part for deposition and permit metallization. Following conventional pretreatment steps, a part to be plated is then immersed into a catalyst solution containing noble metals to render nonconductive surfaces catalytic to deposition of the desired plating metal. An example of a noble metal catalyst is disclosed in U.S. Pat. No. 3,011,920 incorporated herein by reference. The patent teaches treatment of the dielectric substrate with a colloidal palladium solution to render it catalytic to deposition of the dissolved metal.

Following catalysis, the part is then immersed into an electroless plating solution containing dissolved metals which, in contact with the plating catalyst, results in deposition of a coating of the metal onto the catalyzed surface.

Known procedures for electroless deposition of metal for EMI shielding are acknowledged by the art to provide superior coatings. However, one problem associated with their use is that the coating process is not selective. Coating is by immersion of the entire part to be plated into a liquid treatment solution—i.e., a colloidal catalyst solution followed by a metal plating solution. The result is that metal is plated over the entire surface of the nonconductor. Where aesthetics are important in the marketing of electronic components, a metal coated housing for the component is undesirable and typically, the industry paints the metal coating. This is a time consuming and wasteful step, especially where housings are most often molded in a desired color. For this reason, it would be desirable to have a selective process for plating only the interior of the housing without plating the exterior of the housing.

An attempt at selective plating of housings for EMI protection is disclosed in U.S. Pat. No. 4,670,306 incorporated herein by reference. In this patent, a process is taught comprising applying an adsorptive coating onto selected portions of an electronic housing where plating is desired. Selectivity is achieved by a masking procedure. This creates areas on the housing of differential adsorptivity. Thereafter, the housing is immersed in a catalyst solution and more catalyst is absorbed onto the absorptive coating than onto the balance of the housing thereby permitting selective metal deposition. In commercial practice, however, it has been found that selectivity is not adequate because of the required close control of all plating variables to obtain selectivity.

In published U.K. patent application Ser. No. 2 169 925 A, incorporated herein by reference, another process for selective plating for EMI shielding applications is disclosed. In this process, a lacquer is used having suspended particles of metal which may be in the form of flakes, fibers, particulates and in one embodiment, commercially available silver coated glass spheres. The part to be plated is masked where plating is undesired, spray coated with the lacquer where plating is desired, the mask is removed and the part electrolessly metal plated selectively in a pattern conforming to the lacquer coating. The process of U.K. application Ser. No. 2 169 925 A is an improvement over that of above referenced U.S. Pat. No. 4,620,306 in that better selectivity is obtainable with fewer processing steps. However, a problem encountered with the process is the need to expose and treat metallic (catalytic) particles embedded in and sealed by the lacquer coating during coating and drying to form initiation sites for metallization. The steps of exposing and/or treating the particles prior to plating are costly and time consuming. Additional problems are encountered due to the high levels of metal loading in the lacquer which are normally in the order of 50% w/w. A high loading of metal is costly and the coating formed using this lacquer is rough in appearance as a consequence of the high solids content of the lacquer. Moreover, and possibly due to the rough surface, the metallic particles are poorly adhered to the substrate, flake off during processing and can fall into circuitry causing equipment problems and failures.

In copending U.S. patent application Ser. No. 07/531,156, filed concurrently herewith and assigned to the same assignee as the subject invention, a new plating catalyst is disclosed that is an improvement over the plating catalyst and process disclosed in the aforesaid U.K. patent application No. 2,169,925A. The electroless plating catalyst claimed in the copending application comprises a mixture of several different catalytic particles dispersed in a liquid coating composition. Each of the catalytic particles comprises a reduced noble metal salt deposited onto inert carrier particles such as colloidal carbon or silica. One portion of the catalytic particles comprises a reduced platinum family metal over a particulate carrier and the other reduced silver over a particulate carrier. Preferably, the carrier particles are irregularly shaped and possess jagged edges and most preferably comprise colloidal silica. The liquid coating composition used to carry the catalytic particles is a resin in a solvent such as a paint or varnish base and may be organic or aqueous, but is preferably an organic lacquer made using a solvent that softens the top surface of the nonconductor over which metal is to be plated.

In copending U.S. patent application Ser. No. 07/531,155 filed concurrently herewith and assigned to the same assignee as the subject invention, another new plating catalyst is disclosed that is based upon the discovery that the catalytic particles of the platinum family of metals may be eliminated from the catalyst without significant sacrifice to the time required to initiate deposition or the quality of the deposit obtained provided a plating solution with a strong reducing agent is used. Hence, the plating catalyst disclosed in said application is similar to that of copending application 07/531,156 in that it comprises reduced silver over a particulate carrier dispersed in a liquid coating composition but does not contain catalytic particles of a reduced platinum family metal over a particulate carrier.

SUMMARY OF THE INVENTION

The plating catalyst of this invention is an improvement over the plating catalyst of copending U.S. patent applications Ser. Nos. 07/531,156 and 07/531,155 in that it has now been found that particles dispersed within a catalytic coating composition may have a hydrous oxide of a catalytic metal adsorbed on their surface which hydrous oxide becomes catalytic to electroless metal deposition when reduced by contact with a solution of a reducing agent such as the reducing agent contained in an electroless plating solution. Accordingly, the plating catalyst of this invention comprises particles dispersed in a liquid coating composition, the particles having a hydrous oxide of a catalytic metal adsorbed on their surface. The hydrous oxide is of a metal that is catalytic to electroless metal deposition when in reduced form and more preferably, the hydrous oxide is of a noble metal. The carrier particles onto which the hydrous oxide is adsorbed are preferably irregularly shaped and possess jagged edges and most preferably comprise colloidal silica. The liquid coating composition in which the particles are dispersed to form the plating catalyst is a resin in a solvent such as a paint or varnish base and may be organic or aqueous, but is preferably an organic lacquer made using a solvent that softens the top surface of the nonconductor over which metal is to be plated.

The electroless plating process of the invention is characterized by fewer processing steps and is an improvement over the process of U.K. patent application No. 2,169,925A in that it does not require a step of exposing and/or treating catalytic metal particles prior to electroless metal plating as is required in said U.K. patent application. The process of the invention permits plating at a good plating rate and results in a deposit that is and remains strongly adhered to its underlying substrate during prolonged use. The invention is especially useful for formation of selectively deposited metal coatings and is especially suitable for the formation of EMI coatings on housings for electronic components.

Using a preferred electroless plating catalyst for purposes of illustration, upon application of the coating composition on a plastic substrate, the solvent from the coating composition solvates and softens the plastic. This results in bonding the polymer phase of the coating composition to the plastic substrate over which the catalyst is coated which in turn bonds the particles within the coating composition to the substrate. For reasons to be more fully explained below, the particles protrude from the surface of the coating and upon contact with a reducing agent such as the reducing agent contained in an electroless plating solution, the hydrous oxide is reduced to a catalytic form and is readily metal plated without treatment to expose the particles as required in the prior art. Additionally, the particles are firmly adhered to the substrate and do not flake off during prolonged use of the article. The metal coating formed over the particles is relatively smooth compared to coatings obtained using the catalyst of the aforesaid U.K. patent application.

The electroless plating catalyst of the invention is especially adapted for selective plating. When selectively applied, using conventional masking and spraying procedures as more fully explained below, metallization over the substrate will be selective and in conformity with the applied catalytic coating.

DESCRIPTION OF THE PREFERRED EMBODIMENTS

As aforesaid, the electroless plating catalyst of the invention comprises particles dispersed in a liquid coating composition where the particles have a hydrous oxide of a catalytic metal adsorbed on their surface which hydrous oxide becomes catalytic to electroless metal deposition when reduced by contact with a solution of a reducing agent such as the reducing agent contained in an electroless plating solution. The liquid coating composition comprises one or more film forming resins and other additives dissolved in a solvent.

In accordance with the invention, inert carrier particles over which the hydrous oxide is deposited include known colloidally dispersed particles such as carbon; various types of silicas including synthetic calcined silicas (produced by heating with a flame), synthetic precipitated silicas (produced by chemical reaction), silicas of fossil origin (diatomaceous), detritic natural silicas (powdered or micronized sand); alumina; pigments such as titanium dioxide; etc. Silica is a preferred carrier. Most preferred is an organically coated silica where the organic coating aids in the prevention of settling of the silica from the coating composition during storage. An example of a preferred silica is ED-30 available from W.R. Grace Ltd.

The particle size of the inert carrier particles may range within wide limits, but preferably ranges between about 0.1 and 500 microns, more preferably between about 1 and 250 microns and most preferably between about 1 and 50 microns. The surface areas of such particles typically range between 100 and 900 $m^2/gm$.

In a preferred embodiment of the invention, the inert carrier particles are irregularly shaped rather than smooth such as glass beads. Irregularly shaped particles have jagged edges which penetrate a dried coating following application and drying of the plating catalyst on a substrate. This facilitates initiation of the plating reaction without a need to treat the dried coating to expose the catalytic material.

Various liquid coating compositions containing film forming resins may be used as the carrier for the catalytic particles of the invention. Useful aqueous based coating compositions include solutions of polymers such as acrylic homopolymers or copolymers; polyurethanes; polyamides; polyesters; alkyd resins; ethylene copolymers with acrylates or vinyl acetate; chlorinated or unchlorinated homopolymers or copolymers of vinyl chloride; vinyl acetate or vinyl proprionate; cyclisized or chlorinated rubber; nitrocellulose; ethyl or ethylhydroxy cellulose; coumarine-indene resins; terpene resins; polyvinyl acetal resins; cellulose esters such as cellulose acetobutyrate and cellulose acetoproprionate; shellac; and other natural resins singularly or in combination.

Organic solvent based liquid coating compositions containing film forming resins include solutions of phenolics; epoxies; polyesters; acrylics; hydroxylated copolymers of vinyl chloride and vinyl acetate; amine or amide resins such as polyamides; urea formaldehyde; melamine formaldehyde resins; hexamethoxymethyl melamine; benzoguanamine-formaldehyde resins; isocyanates; etc.

In general, the particles dispersed in the coating composition are prepared by forming a hydrous oxide of a metal catalytic to electroless deposition when in reduced form and adsorbing the hydrous oxide onto the carrier particles. Metals suitable for formation of hydrous oxides are those known to be catalytic to electroless metal deposition and include those more noble than the metal to be plated from solution. Examples of suitable metals for formation of a hydrous oxide in accordance with this invention include copper, silver, gold, platinum, palladium, indium, rhenium, rhodium, etc. The preferred metals are silver and palladium, silver being more preferred. The least preferred metal in accordance with the invention is copper because it is poorly active as a catalyst and therefore requires a high loading in the coating composition.

The formation of hydrous oxides of many metals, including those contemplated herein, is disclosed in U.S. Pat. No. 3,657,003 granted Apr. 18, 1972 and in *Inoroanic Colloid Chemistry* by H. B. Weiser, Vol II, "The Hydrous Oxides and Hydroxides," Chapter I, John Wiley and Sons, Inc., New York (1935), both incorporated herein by reference. The meaning of the term hydrous oxide as used herein is in accordance with the definition in the above cited patent.

Metal hydrous oxides are formed by preparing an aqueous solution of a salt of the desired metal with agitation, pH adjustment and heat as necessary to obtain complete dissolution of the salt in solution. Thereafter, a hydrolysis and nucleation reaction is permitted or caused to take place at a controlled rate within the solution. This reaction takes place until a hydrous oxide is formed in situ. The hydrolysis reaction is permitted to continue until the solubility limit of the solution is exceeded to form a separate, dispersed colloidal phase. Details of the hydrolysis reaction can be found in the above cited references and do not constitute a part of this invention though the use of the hydrous oxide colloids to form a plating catalyst is considered inventive.

Examples of formation of hydrous oxides suitable for use in the subject invention follow.

EXAMPLE 1

Formation of a hydrous oxide of palladium—A 1 weight percent solution of palladium chloride may be dissolved in 100 milliliters of water. The mixture may then be stirred until the maximum amount of palladium chloride is dissolved. The pH of the solution at this point would be about 2.7 but would decrease, slowly with formation of a murky brown hydrous oxide colloid of palladium.

EXAMPLE 2

Formation of hydrous oxide or palladium—alternative method - 10 ml of a 5 percent stock solution of palladium chloride may be added to 100 ml of water. The initial pH of the solution would then be raised with dilute sodium hydroxide to a pH of about 3.0 to form a brown hydrous oxide colloid.

EXAMPLE 3

Formation of a hydrous oxide or platinum—A 1 percent solution of platinous dichloride may be formed by dissolving the salt in 100 ml of hot (70° C.) dilute hydrochloric acid. After cooling to room temperature, the pH of the solution may then be raised to 3 with sodium hydroxide to form a yellow hydrous oxide colloid of platinum.

EXAMPLE 4

Formation of a hydrous oxide of copper—A 1 percent solution of cupric chloride may be formed by dissolving the cupric chloride in 100 millilirers of water. The solution may then be heated to about 70° C. while the pH would be continuously adjusted as necessary at about 6 with sodium hydroxide. After about 60 minutes of heating, a deep blue hydrous oxide of copper would be formed.

EXAMPLE 5

Formation of a hydrous oxide of silver—a 0.25 weight percent solution of silver nitrate may be formed by dissolving the salt in 100 ml of water with the pH raised rapidly to about 7 with sodium hydroxide. The pH would then be slowly raised with sodium hydroxide to a range of from 8 to 9 to form a milky white hydrous oxide of silver.

EXAMPLE 6

Formation of a hydrous oxide of gold—a 1 percent solution of auric chloride would be dissolved in 100 milliliters of water to produce a yellow solution. The pH would then be slowly raised over a period of 2 days to about 4 to 5 with sodium hydroxide. During the raising of the pH, the solution would be continuously stirred and slightly heated to about 40° C. to form a brown hydrous oxide of gold colloid.

The hydrous oxide, as formed above, may be formed in the presence of a dispersed particulate carrier to cause adsorption of the hydrous oxide colloid onto the particulate carrier as the hydrous oxide is formed. Alternatively, the hydrous oxide may be formed and the particulate carrier added to the colloidal solution of the hydrous oxide to adsorb the hydrous oxide onto the carrier. If the plating catalyst is to be an aqueous based composition, the particulate carrier having the adsorbed hydrous oxide on its surface may then be dispersed in the coating composition. If the plating catalyst is to be an organic coating composition, the particulate carrier having the adsorbed hydrous oxide on its surface may be recovered by filtration, washed and then dispersed in the coating composition. Dispersion of the particles in the coating composition may be assisted by stirring or preferably ultrasonic agitation to break colloidal agglomerates as is known in the art.

In that embodiment of the invention where the particulate carrier coated with the hydrous oxide is dispersed in an organic medium, following washing, the particulate carrier may be suspended in an organic solvent and the suspension added to the coating composition. The solvent used typically is an organic solvent compatible with the liquid coating composition. It is also desirable that the organic solvent solvate or condition the substrate over which the catalytic coating composition is coated in order to promote bonding or adhesion of the coating of the catalyst to the substrate. Solvation of the substrate, as is known in the art, means softening the substrate without dissolving the same. This permits penetration of the substrate by the coating medium.

Solvating solvents for ABS are shown in U.S. Pat. No. 3,445,350 incorporated herein by reference. Solvating solvents for other polymers are disclosed in U.S. Pat. No. 3,754,070, also incorporated herein by reference. To solvate the substrate, it is preferred that a polar solvent be used, more preferably an oxygenated solvent such as an alcohol, ether or ether acetate. Suitable solvents include isopropyl alcohol, ethanol, methanol, acetone, methyl ethyl ketone, ethyl acetate, the Cellosolve acetates such as butyl cellosolve acetate and propylene glycol alkyl ether acetate, butyl carbitol, etc. The combination of a specific solvent with a specific substrate would depend upon the solvency of the solvent for the substrate. Solvents used to formulate the electroless plating catalyst can also be used to dilute the same as necessary for use. A solvating solvent for the substrate may also be added to the plating catalyst when diluting the catalyst for use.

The concentration of components in the plating catalyst following dilution with solvent is not critical. The metal content of the composition as adsorbed on the particulate carrier (expressed as metal) is preferably in an amount of from about 0.5 to 5.0 grams per liter of solution, more preferably, in an amount of from about 1.0 to 25.0 grams per liter and most preferably, in a range of 1.5 to 10.0 grams per liter. The particulate carrier over which the hydrous oxide is deposited is present in solution in an amount of from 1 to 50 times the weight of the metal portion of the hydrous oxide and more preferably in an amount of from 2 to 15 times the weight of the metal.

A made up plating catalyst ready for use will contain the carrier particles coated with the hydrous oxide, other dissolved solids conventionally found within a coating composition—i.e., resins, polymers, pigments, etc., all hereinafter collectively referred to as the "dried coating solids", and the solvent for the coating composition. In a preferred embodiment of the invention, the concentration of the dried coating solids by weight to the suspended particles in the made up plating catalyst varies from about 2 to 1 to 50 to 1 and more preferably, varies from about 1 to 1 to 25 to 1.

Nonconductive substrates capable of metal plating using the plating catalyst of the invention include polymers such as polyphenylene oxide, acrylonitrile-butadiene-styrene (ABS) copolymers, polystyrene, polycarbonate, epoxy resins, polyvinyl chloride, polyethylene, polypropylene, polyethylene oxide terephthalate, fluorine polymers such as polytetrafluoroethylene, and other natural and synthetic polymers and blends of the aforesaid. The substrate may also include non-metallic materials such as silicate and non-silicate glasses, for example, quartz, soda lime float or plate glass, borosilicate, lead borate, alumino-silicate, alumina ceramic and tin oxide.

Application of the plating catalyst is by use of standard methods and equipment. A substrate is pretreated using standard methods and the coating is preferably applied by spraying, although brushing or other means of selectively applying the coating are applicable. Surfaces that are not to be coated are masked prior to application of the coating.

Following application of a coating of plating catalyst, the mask is removed whereby the coating is over the substrate in a selective pattern. Preferably, the coating is dried prior to electroless plating. Using the coating of the present invention, a recommended period of air drying is from 15 to 20 minutes followed by oven drying at a temperature not exceeding 100° C. for a period of time less than 60 minutes. This cures the coating and promotes adhesion of the coating to the substrate and an electroless metal plate over the coating. During drying, solvents present in the coating of the plating catalyst act to solvate the substrate and create a stronger bond between the substrate and the coating. Entrapped particles microscopically protrude from the surface and provide activation sites for subsequent electroless metal deposition following contact with a reducing agent to reduce the hydrous oxide to a reduced catalytic form.

Electroless metal plating is accomplished using standard prior art plating solutions such as those disclosed in U.S. Pat. No. 3,765,936; U.S. Pat. No. 3,728,137; and U.S. Pat. No. 3,661,597, all incorporated herein by reference. Other electroless plating solutions known to those skilled in the art would also be suitable for purposes of the subject invention. As is known in the art, an electroless plating solution contains a reducing agent which is necessary to cause the plating reaction to occur. For example, an electroless copper plating solution contains formaldehyde or a borane or an amine borane. An electroless nickel solution contains hypophosphite as a reducing agent. When the reducing agent in the electroless plating solution comes into contact with the hydrous oxide on the surface of the particles protruding from the coating, it is believed that the contact causes reduction of the hydrous oxide to a reduced catalytic form whereby the particles are catalytic and suitable for use as an electroless plating catalyst. Though this embodiment of the invention has been described using a reducing agent within a plating solution to reduce the hydrous oxide, it should be understood that the hydrous oxide may be reduced by contact with a separate solution of a reducing agent followed by contact with the electroless plating solution.

For EMI shielding, a dual layer of electroless copper followed by electroless nickel is preferred. Such a dual layer is disclosed in the above referenced U.S. Pat. No. 4,514,486. Using the process of this invention, including masking means to obtain selectivity, EMI shields are obtained in a selective pattern whereby the aesthetic features of a molded housing, for example, are preserved, while an effective EMI shield is provided.

The invention will be better understood by reference to the examples which follow. These examples are not intended to limit the scope of the invention.

EXAMPLE 7

This example represents the preferred embodiment of the invention.

Particles having an adsorbed hydrous oxide of silver are prepared using the following formulation:

| | |
|---|---|
| Silver Hydrous oxide[1] | 4.00 gm |
| Isopropyl Alcohol | 35.00 gm |
| Acetone | 23.00 gm |
| Ethyl Acetate | 40.00 gm |
| Silica Type OK 412 | 19.00 gm |
| Varnish (LS123)[2] | 346.00 ml |

[1]Such as prepared in Example 5 and removed by filtration and washing
[2]L123 Polycarbonate Varnish from Bee Chemicals The silver hydrous oxide and silica particles are added to the solvents with stirring. Varnish is then added with stirring and ultrasonic agitation to disperse any agglomerates formed.

EXAMPLE 8

A portion of a polycarbonate housing was masked and prepared for plating. The formulation of Example 7 was diluted with 50 ml of a composite thinner (54 volume percent acetone, 22 percent isopropyl alcohol and 24 percent ethyl acetate) and sprayed onto the polycarbonate substrate. The coating was applied at a wet thickness of about 3 mils at 25 psi air pressure. Following spraying, the coated part was allowed to air dry for about 1 hour and then placed in a hot air convection oven and dried at 100° C. for 10 minutes to provide a final dried coating of about 0.5 mil thickness.

Following drying, the mask was removed and the substrate plated by immersion in a proprietary electroless copper plating solution identified as Cuposit ® 251 electroless copper and comprising cupric ions, complexing agent, formaldehyde and hydroxide for pH control. The plating solution was maintained at 40° C. Plating was initiated in about 2.5 minutes and plating continued for 30 minutes. Following plating, the substrate had a coating of copper about 0.1 mil thick deposited only on the areas of the substrate spray coated with the electroless plating catalyst. The deposit obtained had a relatively smooth matt pink finish of copper. Testing of suitability of the part as an EMI shield showed results of <0.02 ohms/sq.

We claim:

1. A process for electroless deposition of metal on a substrate comprising coating the substrate with a composition comprising a polymer solution having particles homogeneously dispersed therein, said particles comprising an inert particulate carrier coated with a hydrous oxide of a metal insoluble in the polymer solution that is catalytic to electroless metal deposition when in a reduced form, said hydrous oxide having a metal content of from 0.5 to 50 grams per liter of coating composition, drying the coating and contacting said treated substrate with an electroless metal plating solution.

2. The process of claim 1 including a step of baking the substrate following application of the catalyst to remove solvent and bond the catalyst to the substrate.

3. The process of claim 1 where the solvent used in the liquid film forming coating composition is a solvent that solvates the substrate.

4. The process of claim 3 where said substrate is a housing for electronic equipment.

5. The process of claim 3 where a portion of the substrate is masked before coating with the electroless plating catalyst and the mask is removed prior to electroless metal deposition to achieve selective plating.

6. The process of claim 3 where the substrate is of an ABS resin.

7. The process of claim 3 where the substrate is of a polycarbonate resin.

8. An article of manufacture comprising a housing for an electronic component and a metal coating over at least a portion thereof in a thickness adequate to inhibit emission of electromagnetic wave energy, said metal coating being bonded to said housing through an intermediate layer, said intermediate layer being the product formed by applying a coating composition to said housing comprising a polymer solution having particles homogeneously dispersed therein, said particles comprising an inert particulate carrier coated with a hydrous oxide of a metal insoluble in the polymer solution that is catalytic to electroless metal deposition when in a reduced form, said hydrous oxide having a metal content of from 0.5 to 50 grams per liter of coating composition, drying the coating composition and reducing the hydrous oxide to metal.

9. The process of claim 8 where the housing is of polycarbonate.

* * * * *